(12) United States Patent
Sugawara

(10) Patent No.: US 7,111,212 B2
(45) Date of Patent: Sep. 19, 2006

(54) DEBUGGING SYSTEM FOR SEMICONDUCTOR INTEGRATED CIRCUIT

(75) Inventor: Akihiko Sugawara, Kanagawa (JP)

(73) Assignee: Sony Computer Entertainment Inc., (JP)

( * ) Notice: Subject to any disclaimer, the term of this patent is extended or adjusted under 35 U.S.C. 154(b) by 618 days.

(21) Appl. No.: 10/145,228

(22) Filed: May 14, 2002

(65) Prior Publication Data
US 2002/0194542 A1 Dec. 19, 2002

(30) Foreign Application Priority Data
May 18, 2001 (JP) ............... 2001-149977
Mar. 6, 2002 (JP) ............... 2002-059998

(51) Int. Cl.
G01R 31/28 (2006.01)
(52) U.S. Cl. ............... 714/724; 714/39; 714/45
(58) Field of Classification Search ............ 714/25, 714/34, 724, 33, 31, 38, 39, 45
See application file for complete search history.

(56) References Cited

U.S. PATENT DOCUMENTS

| | | | |
|---|---|---|---|
| 4,710,932 A | | 12/1987 | Hiroshi |
| 5,907,671 A | | 5/1999 | Chen et al. |
| 6,205,560 B1 | * | 3/2001 | Hervin et al. ............ 714/34 |
| 6,523,136 B1 | * | 2/2003 | Higashida ............ 714/30 |
| 6,584,590 B1 | * | 6/2003 | Bean ............ 714/724 |
| 6,779,145 B1 | * | 8/2004 | Edwards et al. ......... 714/733 |

FOREIGN PATENT DOCUMENTS

| | | |
|---|---|---|
| CA | 1197322 A1 | 11/1985 |
| EP | 0073602 A2 | 3/1983 |
| JP | 02-077938 A | 3/1990 |
| JP | 06-214819 A1 | 8/1994 |

* cited by examiner

Primary Examiner—Guy Lamarre
Assistant Examiner—Esaw Abraham
(74) Attorney, Agent, or Firm—Lerner, David, Littenberg, Krumholz & Mentlik, LLP

(57) ABSTRACT

A plurality of semiconductor integrated circuits have the same configuration as that of an LSI which is subjected to debugging. Different internal signals are respectively collected from the semiconductor integrated circuits under the same operation conditions. The operation of the LSI is analyzed based on the collected internal signals. By doing this, it is not necessary to add output terminals to the LSI or switch the internal signals output from output terminals at periodic time intervals. This facilitates the debugging of the entire LSI in a low-cost and simple configuration.

10 Claims, 3 Drawing Sheets

DEBUGGING SYSTEM FOR SEMICONDUCTOR INTEGRATED CIRCUIT

CROSS-REFERENCE TO RELATED APPLICATIONS

This application claims priority from Japanese Patent Application No. 2001-149977 filed on May 18, 2001 and No. 2002-059998 filed on Mar. 6, 2002, the disclosures of which are hereby incorporated by reference herein.

BACKGROUND OF THE INVENTION

The present invention is related to a debugging system for analyzing internal signals of LSIs and debugging (fixing defects or errors) hardware or software within the LSIs, a semiconductor integrated circuit, a debugging method thereof, a debugging program for the semiconductor integrated circuit, and a computer-readable recording medium having recorded thereon the debugging program for the semiconductor integrated circuit.

In general, debugging processing of hardware and software within an LSI (LSI: Large Scale Integration) is performed by observing and analyzing internal signals of the LSI utilizing a measuring device such as a logic analyzer or oscilloscope. It is thus important to observe and analyze as many internal signals as possible through the debugging processing in order to design and manufacture an LSI having no defects or errors.

However, in the case that output terminals of the LSI are added to observe as many of the internal signals as possible, the LSI may have a complicated configuration and large dimensions, and further may become expensive.

To overcome such problems, it can be considered that internal signals output from output terminals are switched every period of time, whereupon a plurality of internal signals cannot be observed at the same time, so that a correlation between internal signals is not analyzable, so that debugging of the entire LSI can not be performed accurately.

SUMMARY OF THE INVENTION

Accordingly, in consideration of the above-noted problems, it is an object of the present invention to provide a debugging system, a semiconductor integrated circuit, a debugging method thereof, a debugging program for the semiconductor integrated circuit, and a computer-readable recording medium having recorded thereon the debugging program for the semiconductor integrated circuit, all of which are capable of readily debugging the entire LSI at a low-cost and with a simple configuration.

The present invention utilizes a plurality of debugging semiconductor integrated circuits having the same configuration as that of a designated semiconductor integrated circuit which is subjected to debugging. Different internal signals are respectively collected from the debugging semiconductor integrated circuits while they are under the same operation condition. Internal signals proportional to the number of debugging semiconductor integrated circuits are collected, and the operation of the designated semiconductor integrated circuit is analyzed based on the collected internal signals.

According to this configuration, it is not necessary to add output terminals of the designated semiconductor integrated circuit or to switch the internal signals produced at the output terminals during every period of time, thereby enabling debugging of the entire designated semiconductor integrated circuit without an increase in its cost.

It is alternatively possible to connect three or more semiconductor integrated circuits in which internal signals that are all different are collected from the respective semiconductor integrated circuits while two or more of those are under the same operation condition.

It is alternatively possible to connect three or more semiconductor integrated circuits under the same operation condition, wherein internal signals that are all different are collected from two or more of those connected semiconductor integrated circuits.

It is still further possible to connect three or more semiconductor integrated circuits in which the operation condition of one of those is monitored. Internal signals that are all different are collected from two or more semiconductor integrated circuits while the semiconductor integrated circuits other than the semiconductor integrated circuit being monitored are under the same operation condition as that of the semiconductor integrated circuit being monitored.

Other and further objects and features of the present invention will become obvious upon an understanding of the illustrative embodiments about to be described in connection with the accompanying drawings or will be indicated in the appended claims, and various advantages not refereed to herein will occur to one skilled in the art upon employing the invention in practice.

DETAILED DESCRIPTION

Figure 1:
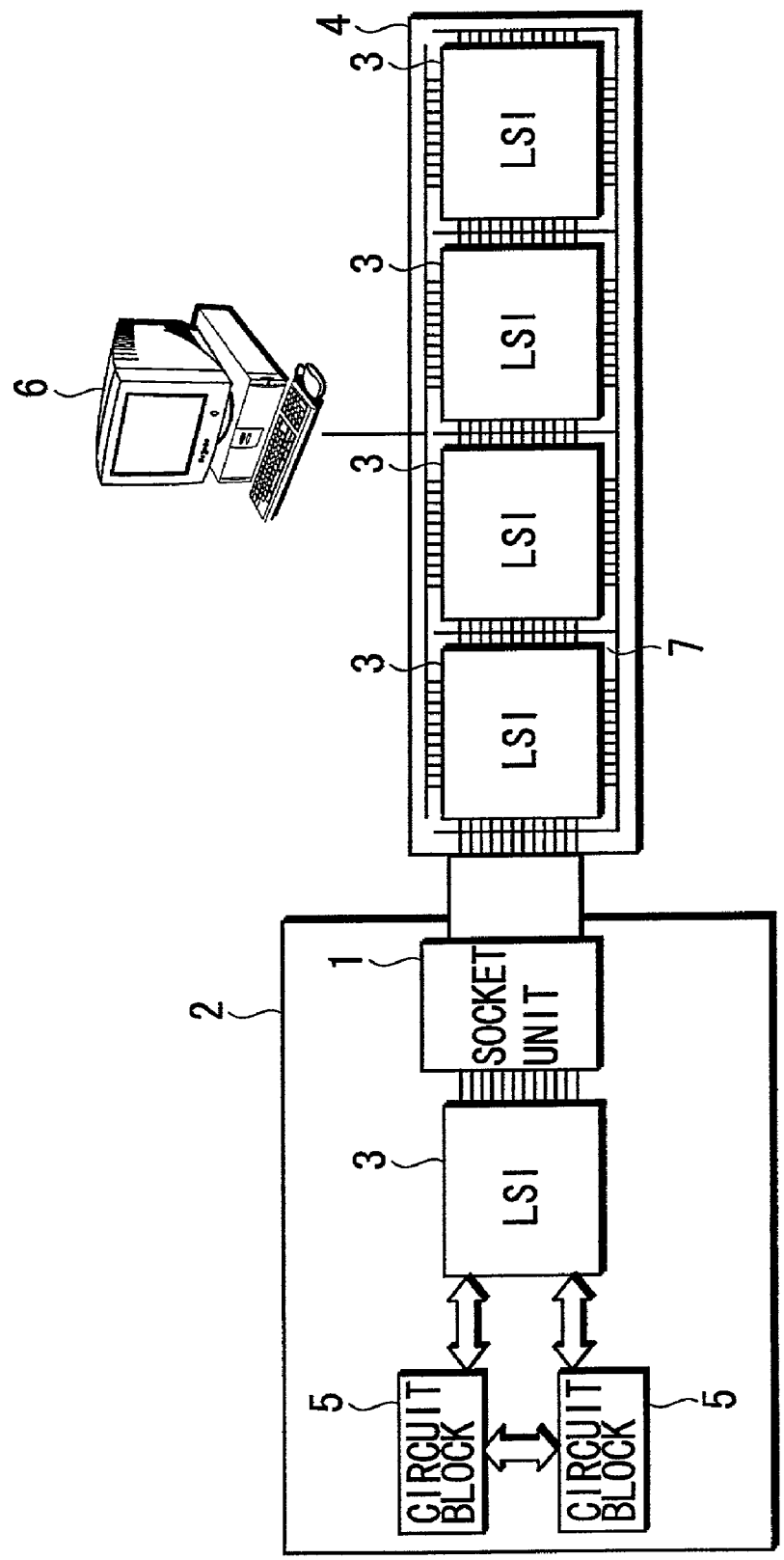
FIG. 1 is a schematic diagram showing the entire configuration of a debugging system according to an embodiment of the present invention.

Various embodiments of the present invention will be described with reference to the accompanying drawings. It is to be noted that the same or similar reference numerals are applied to the same or similar parts and elements throughout the drawings, and that the description of the same or similar parts and elements therefore will be omitted or simplified.

The present invention can be applied to a debugging system which observes and analyzes internal signals of an LSI as shown in FIG. 1.

Configuration of Debugging System

The entire configuration of the debugging system according to an embodiment of the present invention is described with reference to FIG. 1.

As shown in FIG. 1, the debugging system of the embodiment is configured so that a debugging dedicated board 4 is electrically connected via a socket unit 1 to an LSI 3 within a board 2 which is subjected to debugging. The LSI 3 is also connected to other circuit blocks 5 in the board 2.

The debugging dedicated board 4 is connected to a computer system 6 via electric wiring, and is provided with a plurality of LSIs which have the same configuration as that of the LSI 3 (hereinafter, referred to as debug LSIs for the purpose of distinguishing from LSI 3). Output terminals of the LSI 3 and those of the debug LSIs are mutually connected with corresponding terminals through electric wiring 7.

It is to be understood that, in this embodiment, the debugging dedicated board 4 is provided with four debug LSIs, however, the present invention is not limited to this number. Thus, it is possible to add or remove debug LSIs in accordance with the number of internal signals to be observed.

Next, the configuration of the LSI 3 (which is the same for the debug LSIs) is described with reference being made to FIGS. 2 and 3.

Figure 2:
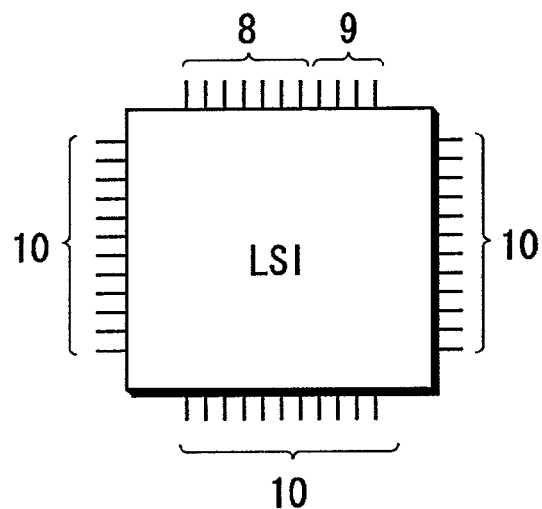
FIG. 2 is a schematic diagram showing the appearance of an LSI within the debugging system in FIG. 1.
Figure 3:
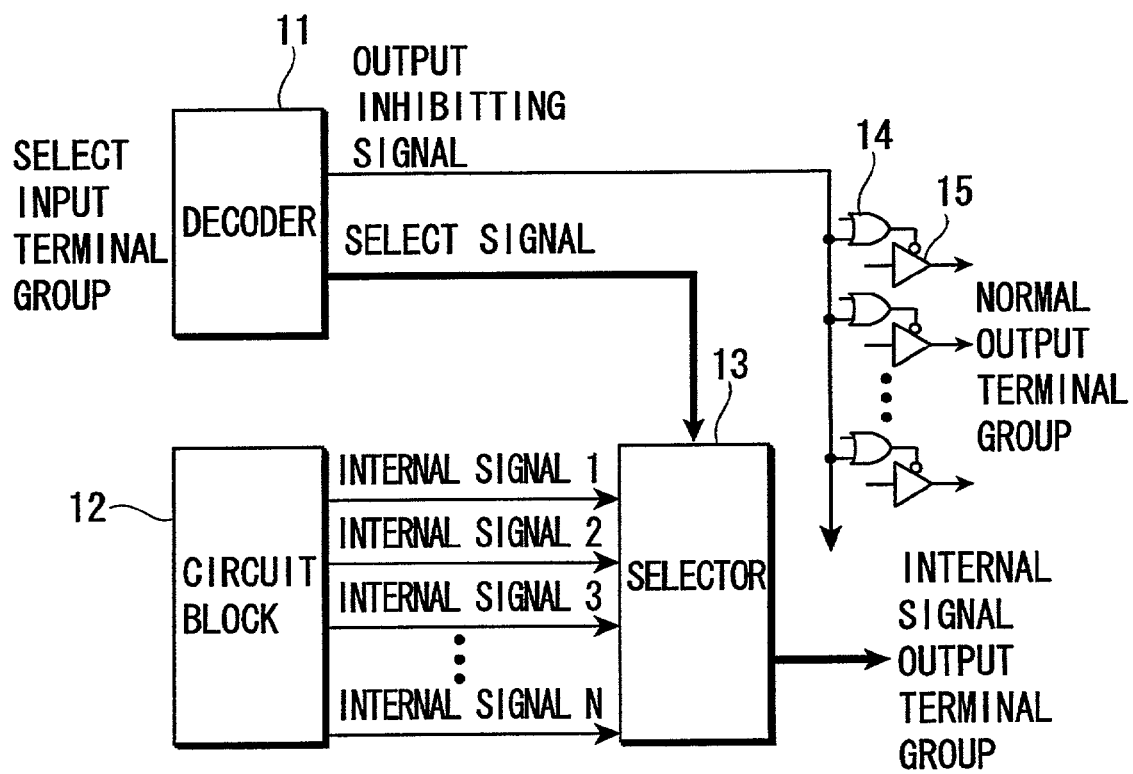
FIG. 3 is a schematic diagram showing the internal configuration of the LSI in FIG. 2.

As shown in FIG. 2, the LSI 3 has a plurality of internal signal output terminals 8, a plurality of selector terminals 9, and a plurality of normal output terminals 10. And, the normal output terminals 10 are connected with those of the debug LSI via a socket unit 1. Provided within the LSI 3 are a decoder 11, a selector 13, AND circuits 14 and buffer circuits 15, as well as a circuit block 12 for realizing various functions of the LSI, as shown in FIG. 3.

The normal output terminals 10 perform normal operation (output internal signals) only when a pattern of the signal input into the selector terminals 9 is a specific one, and in the case of patterns other than the specific one, the normal output terminals 10 are inhibited from outputting internal signals.

Operation of Debugging System

Figure 4:
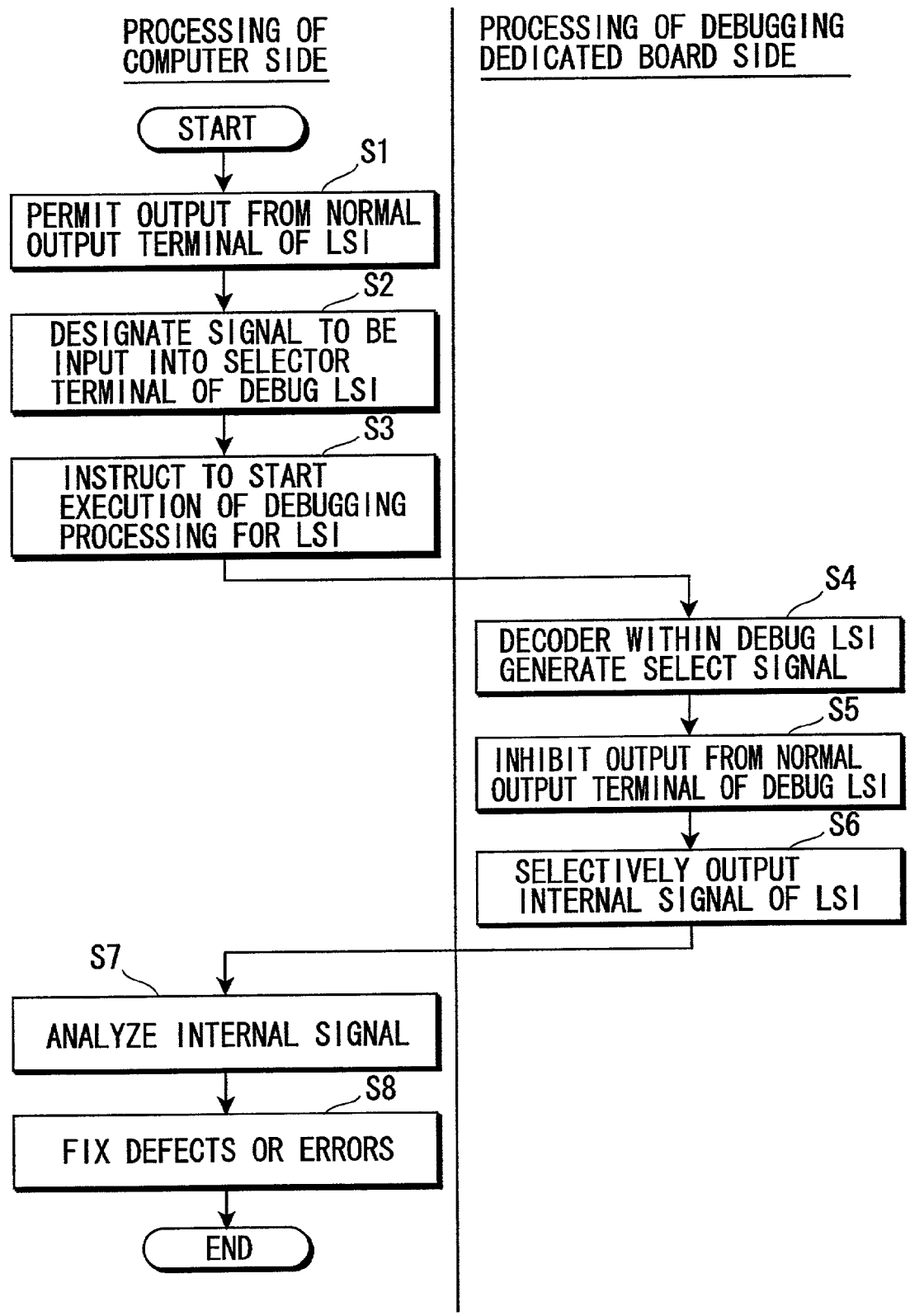
FIG. 4 is a flowchart showing the operation of the debugging system.

A debugging process of the LSI 3, which utilizes the above-mentioned debugging system, is described with reference to FIG. 4.

The process shown in the flowchart of FIG. 4 starts with connecting the LSI 3 with the debugging dedicated board 4 via the socket unit 1 by a debugging process executor (hereinafter, referred to as an operator), at which point the debugging process proceeds to step S1.

In step S1, the operator inputs into the selector terminals 9 of the LSI 3 directly or through the computer system 6 a signal pattern which permits the normal output terminals 10 to output. This allows the LSI 3 to perform normal operation, and internal signals are output from the normal output terminals of the LSI 3. This completes the processing of step S1, whereupon the debugging process proceeds from step S1 to step S2.

In step S2, the operator designates signal patterns, for example, high level/low level, to be input into the selector terminals 9 of the respective debug LSIs by operating the computer system 6.

More specifically, the operator designates signal patterns that are all different for each debug LSI. For example, when the operator inputs a signal pattern of high level/low level into one debug LSI, the operator inputs a different signal pattern of low level/high level into another debug LSI. By doing this, internal signals that are all different for each debug LSI are output from the respective internal signal output terminals of the debug LSIs.

It is noted here that the operator does not designate to the selector terminals 9 of the debug LSIs signal patterns (in the above exemplary case, high level/high level for example) which permit the normal output terminals 10 to have an output. By doing this, internal signals are not output from the normal output terminals 10 of the debug LSIs. However, internal signals are output from the normal output terminals 10 of the LSI 3 to be transmitted to the corresponding normal output terminals 10 of the debug LSIs, so that the debug LSIs apparently perform normal operation. This completes the processing of step S2, whereupon the debugging process proceeds from step S2 to step S3.

In step S3, the operator provides an instruction to execute the debugging process of the LSI 3. Upon such instruction, the computer system 6 outputs to the selector terminals 9 of the debug LSIs the signal patterns designated by the operator in step S2. This completes the processing of step S3, at which point the debugging process proceeds from step S3 to step S4.

In step S4, the decoders 11 in the respective debug LSIs generate select signals to specify internal signals of the circuit block 12 to be selectively output in accordance with the signal patterns input into the selector terminals 9 of the debug LSIs by the computer system 6. This completes the processing of step S4, at which point the debugging process proceeds from step S4 to step S5.

In step S5, the decoders 11 in the respective debug LSIs generate output inhibiting signals which inhibit output from the normal output terminals 10 of the debug LSIs, and then output the output inhibiting signals to the AND circuits 14. This causes the normal output terminals 10 to not output the internal signal of the circuit block 12, at which point the debugging process proceeds from step S5 to step S6.

In step S6, the selectors 13 in the respective debug LSIs select and output the internal signals of the circuit block 12 to the internal signal output terminals 8 in accordance with the select signals generated by the decoders 11. Furthermore, in response to the output inhibiting signals generated by the decoder 11, the AND circuit 14 operates a buffer circuit 15 controlling output from the normal output terminals 10 so as to inhibit output from the normal output terminals 10. This completes the processing of step S6, whereupon the debugging process proceeds from step S6 to step S7.

In step S7, the operator observes the internal signals output from the internal signal output terminals 8 of the respective debug LSIs using the computer system 6, and analyzes problems or errors (bugs) existing in the hardware or software of the LSI 3 by utilizing tools such as a timing analysis program. This completes the processing of step S7, whereupon the debugging process proceeds from step S7 to step S8.

In step S8, on the basis of the analysis results, the operator fixes the defects or errors within the hardware or software of the LSI 3. This completes the debugging process.

As is clear from the foregoing detailed description, in the debugging system according to the embodiment, since internal signals are collected from a plurality of debug LSIs which are all connected to the LSI 3, it is not necessary to add output terminals to the LSI 3 only for collecting the internal signals, nor is it necessary to switch the internal signals output from output terminals at periodic time intervals. This facilitates the debugging of the entire LSI in a low-cost and simple configuration.

Further, in the debugging system of the embodiment, internal signals that are all different from each other can be collected at the same time from the debug LSIs which are under the same operation condition as that of the LSI 3, thereby allowing the operator to observe the correlation between the internal signals and to execute the debugging process of the entire LSI with high accuracy.

Other Embodiments

The foregoing is a description of preferred embodiments of the present invention made by the inventors. However, as will be understood from the foregoing description and drawings which form part of the disclosure, various alternative embodiments, examples and operation techniques will be apparent to those skilled in the art.

For example, although in the foregoing description, processing from step S1 to step S8 are executed in order, it will be understood that processes from step S3 to step S5 are executed substantially at the same time. Out of the processes of step S1 to step S8, in particular, in the case where the processes of step S1 and step S2 are executed in order, signals are output at the same time from the plurality of LSIs if the operator gives signals to the LSI at the wrong time, thereby causing problems which may result in damaging the LSIs. Accordingly, it is desirable to execute the processing of step S1 and step S2 simultaneously in order to prevent such problems from occurring.

According to the foregoing embodiment, although the debugging process is performed by connecting the debugging dedicated board 4 and the computer system 6 with each other, it is alternatively possible to perform the processing by connecting general-purpose measuring devices, such as a logic analyzer and the like, to the debugging dedicated board 4 in place of the computer system 6.

With the foregoing embodiment, by inputting select signals through a plurality of selector terminals, internal signals which are all different are output from a plurality of semiconductor integrated circuits under the same operation condition. However, it will be understood that this is not a restriction. For example, it is preferable that, like a serial input of select information while using fewer selector terminals, a plurality of semiconductor integrated circuits are controllable so as to output internal signals that are all different for every semiconductor integrated circuit.

The operation of the above-described debugging system can be stored as a program on a storage medium from which it can be read into a computer. When executing the debugging process, the storage medium is read into the computer system, and the program is stored in a storage section such as a memory within the computer system. And then, an operation unit executes the program so as to achieve the operation of the above-noted debugging process.

The term storage medium used in this case refers to a computer readable storage medium in which a program can be stored, such as a semiconductor memory, a magnetic disk, an optical disk, a magneto-optic disk, a magnetic tape or the like.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A system for debugging a designated semiconductor integrated circuit, comprising:
a board having a plurality of debugging semiconductor integrated circuits, each of the debugging semiconductor integrated circuits having the same configuration as that of the designated semiconductor integrated circuit; and
analyzing means for collecting different internal signals from the respective debugging semiconductor integrated circuits while the debugging semiconductor integrated circuits are under the same operation condition as the designated semiconductor integrated circuit, and for analyzing the operation of the designated semiconductor integrated circuit based on the collected internal signals.

2. The debugging system according to claim 1, wherein the designated semiconductor integrated circuit has selective output terminals for selectively outputting internal signals of the designated semiconductor integrated circuit in accordance with signal patterns input by the analyzing means.

3. The debugging system according claim 2, wherein the designated semiconductor integrated circuit has output terminals other than the selective output terminals which output the internal signals only when a predetermined signal pattern is input by the analyzing means.

4. The debugging system according to claim 3, wherein the output terminals of the designated semiconductor integrated circuit are connected to corresponding output terminals of the debugging semiconductor integrated circuits, and the predetermined signal pattern is input into at least one of the debugging semiconductor integrated circuits.

5. A method of debugging a designated semiconductor integrated circuit, comprising:
inputting signal patterns to specify internal signals to be collected into a plurality of debugging semiconductor integrated circuits, each of the debugging semiconductor integrated circuits having the same configuration as that of the designated semiconductor integrated circuit;
collecting the internal signals in response to the signal patterns from predetermined output terminals of the respective debugging semiconductor integrated circuits while the debugging semiconductor integrated circuits are under the same operation condition as the designated semiconductor integrated circuit; and
analyzing the operation of the designated semiconductor integrated circuit based on the collected internal signals.

6. The debugging method as claimed in claim 5, further comprising:
connecting output terminals of the respective debugging semiconductor integrated circuits, other than the predetermined output terminals, with corresponding output terminals of the designated semiconductor integrated circuit; and
inhibiting at least one of the debugging semiconductor integrated circuits from outputting internal signals from the output terminals other than the predetermined output terminals.

7. A system for debugging a designated semiconductor integrated circuit, comprising:
a processor for executing instructions; and
instructions, the instructions including:
inputting signal patterns to specify internal signals to be collected into a plurality of debugging semiconductor integrated circuits, each of the debugging semiconductor integrated circuits having the same configuration as that of the designated semiconductor integrated circuit;
collecting the internal signals in response to the signal patterns from predetermined output terminals of the respective debugging semiconductor integrated circuits while the debugging semiconductor integrated circuits are under the same operation condition as the designated semiconductor integrated circuit; and
analyzing the operation of the designated semiconductor integrated circuit based on the collected internal signals.

8. A computer-readable recording medium having recorded thereon a program to be executed on a computer for debugging a designated semiconductor integrated circuit, the program comprising:
inputting signal patterns to specify internal signals to be collected into a plurality of debugging semiconductor integrated circuits, each of the debugging semiconductor integrated circuits having the same configuration as that of the designated semiconductor integrated circuit;

collecting the internal signals in response to the signal patterns from predetermined output terminals of the respective debugging semiconductor integrated circuits while the debugging semiconductor integrated circuits are under the same operation condition as the designated semiconductor integrated circuit; and analyzing the operation of the designated semiconductor integrated circuit based on the collected internal signals.

9. The computer-readable recording medium according to claim 8, wherein the program further comprises:

connecting output terminals of the respective debugging semiconductor integrated circuits, other than the predetermined output terminals, with corresponding output terminals of the designated semiconductor integrated circuit; and inhibiting at least one of the debugging semiconductor integrated circuits from outputting internal signals from the output terminals other than the predetermined output terminals.

10. A system for debugging a designated semiconductor integrated circuit, comprising:

a board having a plurality of debugging semiconductor integrated circuits, each of the debugging semiconductor integrated circuits having the same configuration as that of the designated semiconductor integrated circuit; and an analyzing unit for collecting different internal signals from the respective debugging semiconductor integrated circuits while the debugging semiconductor integrated circuits are under the same operation condition as the designated semiconductor integrated circuit, and for analyzing the operation of the designated semiconductor integrated circuit based on the collected internal signals.

* * * * *